(12) United States Patent
Zhong et al.

(10) Patent No.: US 6,634,012 B2
(45) Date of Patent: Oct. 14, 2003

(54) DESIGN VERIFICATION BY SYMBOLIC SIMULATION USING A NATIVE HARDWARE DESCRIPTION LANGUAGE

(75) Inventors: John Xiaoxiong Zhong, Fremont, CA (US); Dian Yang, Sunnyvale, CA (US); Zheng Zhou, San Jose, CA (US); Ting Wang, Fremont, CA (US)

(73) Assignee: Innologic Systems, Inc., San Jose, CA (US)

( * ) Notice: Subject to any disclaimer, the term of this patent is extended or adjusted under 35 U.S.C. 154(b) by 0 days.

(21) Appl. No.: 09/395,873

(22) Filed: Sep. 14, 1999

(65) Prior Publication Data

US 2003/0066039 A1 Apr. 3, 2003

(51) Int. Cl.[7] ................................. G06F 9/45
(52) U.S. Cl. ............................... 716/5
(58) Field of Search ......................... 716/4, 5

(56) References Cited

U.S. PATENT DOCUMENTS 5,910,897 A * 6/1999 Dangelo ............... 364/488
6,295,623 B1 * 9/2001 Lesmeister ............ 714/741

OTHER PUBLICATIONS

Martinolle, F. et al., "A procedural language interface for VHDL and its typical applications". Jan. 1998. ACM. pp. 32–38.*

Gough, G. et al., "A design and verification environment for ELLA". Sep. 1995. IEEE. pp. 685–690.*

Wan, B. et al., "VHdbx: an X window system based high level debugger for the VHDL simulation environment". Oct. 1995. IEEE, pp. 358–360.*

Viklund, L. et al., "An object–oriented language for symbolic computation—applied to machine element ananlysis". 1992. ACM. pp. 397–405.*

Dawson, C. et al., "The verilog procedural interface for the verilog hardware description language". 1996, IEEE, pp. 17–22.*

Meyer, S. "Verilog plus c language modeling with PLI 2.o: the next generation simulation language", Mar. 1998, IEEE. pg.s 98–105.*

York, G. "an integrated environment for HDL verification". Mar. 1995, IEEE. pg.s 9–18.*

* cited by examiner

Primary Examiner—John F. Niebling
Assistant Examiner—Stacy Whitmore
(74) Attorney, Agent, or Firm—Blakely, Sokoloff, Taylor & Zafman LLP

(57) ABSTRACT

A method and apparatus for performing design verification is described. In one embodiment, a method for performing design verification includes specifying at least one object that represents at least one signal as a symbol in a design using a first command and instructing a symbolic simulator with the first command to treat the at least one object as a symbol.

18 Claims, 2 Drawing Sheets

DESIGN VERIFICATION BY SYMBOLIC SIMULATION USING A NATIVE HARDWARE DESCRIPTION LANGUAGE

FIELD OF THE INVENTION

The present invention relates to the field of design simulation and verification; more particularly, the present invention relates to augmenting design descriptions to perform design verification by symbolic simulation.

BACKGROUND OF THE INVENTION

The sophistication of modern integrated circuit (IC) design means that designers have to rely on automation tools (ICDA) to manage the complexity. Over the past two decades, new tools have continually been developed to increase the level of automation and enable designers to develop increasingly complex and powerful IC products.

The increasing demand for new IC design tools is fueled by rapidly changing IC fabrication process technology. As IC feature sizes shrink to dimensions of 0.25 micron and smaller, the complexity of the designs (number of devices on a single chip) drives the need for improved techniques to design and verify the required functionality.

The continuing increase in IC design complexity, along with the lack of specific automation tools, has led to design verification becoming a major design bottleneck.

There are a number of alternatives currently being used to reduce the verification bottleneck. These include both dynamic and static verification. Dynamic verification is the standard approach to verification. Recent advances in dynamic verification can be categorized into two categories: testbench management and augmented verification techniques.

Testbench management tools abstract the creation of test vectors to a higher level. These tools provide a language to help an individual create tests and measurement tools to help the individual quantify how good coverage is. Testbench management has a number of advantages that include providing an evolutionary step to the problem of design verification, automating many of the repetitive tasks and helps the designer focus on the problem of what to test, and providing a way of reducing the ambiguity of the test specification. Testbench management provides a number of disadvantages which include being based on the continued use of digital or binary simulation and large numbers of test vectors, forcing a designer to use a proprietary test language to express tests, and having non-simplified debugging.

Augmented verification techniques can be used with existing approaches and testbench management tools. Testbench management tools provide some augmented verification techniques, but these augmented techniques seek to improve measurement and increase test coverage. The use of augmented verification techniques is advantageous in that it provides an evolutionary step to the problem of design verification, improves the observability of the tests, and automates some of the steps of test creation to improve the scope of testing. The disadvantages of augmented verification techniques include being based on the use of binary simulation and large numbers of vectors, forcing a designer to use a proprietary methodology, and having no guarantee that the tests will catch all problems.

Static verification is a new technology that attempts to formally prove that a design meets its specifications.

Other verification techniques include equivalence checking which compares two gate level netlists is fairly established and its benefits are not an issue. However, application of the same formal techniques to compare RTL or behavior against a specification is still problematic. Model checking (behavior/RTL—RTL/gate checking) is still in the very early stages of use. Its inherent limitation of a maximum of about 200 registers means that model checking has very limited use without extensive engineering effort.

The advantages of this approach include providing exhaustive and conclusive proof that the design is correct, managing non-linear growth in design size, and providing rapid response and precise debugging. The disadvantages of this approach include having technical limitations such that it is only appropriate for a very small number of designs, very hard for engineers to grasp, and demands substantial reworking of design capture techniques.

Both dynamic and static approaches have merit; however, there is an immediate problem that neither approach can solve today. Until now, there has been no adequate solution to the growing crisis of design verification. Existing simulation techniques are not able to keep up with complexity growth. Formal techniques have too many restrictions and functional verification is the major cause of problems in a design project. Therefore, a need exists to provide an improved simulation technique that reduces the number of restrictions that currently exist in a design project.

SUMMARY OF THE INVENTION

A method and apparatus for performing design verification is described. In one embodiment, a method for performing design verification includes specifying at least one object that represents at least one signal as a symbol in a design using a first programming interface call and instructing a symbolic simulator with the first programming interface call to treat the at least one object as a symbol.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1:
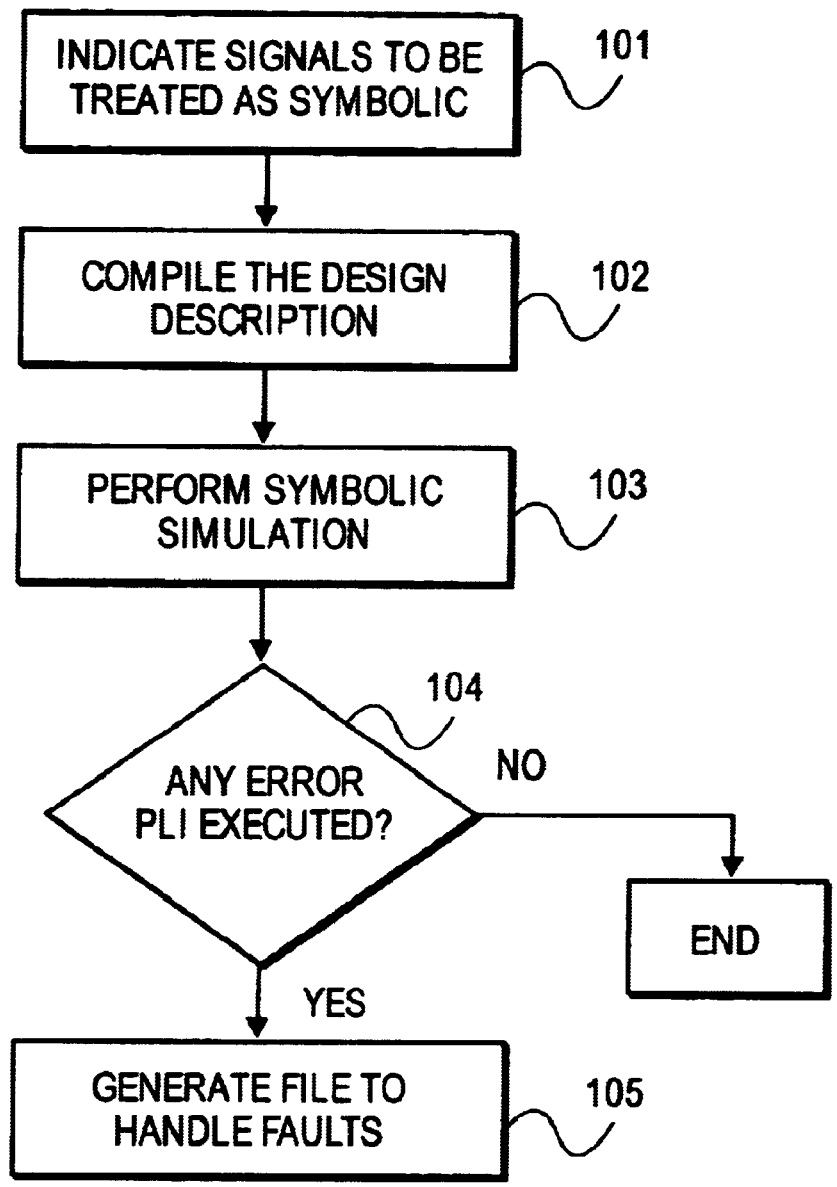
FIG. 1 is a flow diagram of one embodiment of a process for verifying a design.

A method and apparatus for improved design verification is described. In the following description, numerous details are set forth. It will be apparent, however, to one skilled in the art, that the present invention may be practiced without these specific details. In other instances, well-known structures and devices are shown in block diagram form, rather than in detail, in order to avoid obscuring the present invention.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The present invention also relates to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, and each coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description below. In addition, the present invention is not described with reference to any particular programming language. It will be appreciated that a variety of programming languages may be used to implement the teachings of the invention as described herein.

Overview

The present invention allows hardware description languages that are normally used to describe designs to be used in symbolic simulators. The present invention allows this instructing the symbolic simulator to treat one or more specified signals (e.g., inputs) as symbolic.

In one embodiment, the simulator is instructed through the use of one or more programming commands, or statements, (e.g., programming interface calls (PLIs)) that declare certain variables as symbols. That is, a command may be used to indicate to the simulator that an object in a hardware description language used to indicate a signal (e.g., a Verilog object) is to be a symbol to the simulator, such that variable assigned objects are designated as symbolic variable objects. In this manner, the existing hardware description languages are able to support the specification of symbolic input. Upon encountering such a programming statement, the symbolic simulator propagates logic expressions, instead of binary values, capturing the relationship from input to output.

The present invention permits a check to be inserted to perform a complete test and generate information allowing the re-creation of any identified fault. In one embodiment, the simulator is instructed to perform the check through the use of one or more programming statements that generate a file of one or more vectors (e.g., binary vectors) that may be used to locate any identified fault, thereby simplifying debug. Once an error has been identified, well-known simulators that employ binary numbers may be used to isolate the fault.

By using symbolic simulation, in one simulation run, many combinations of binary simulation runs are achieved to verify the design, such that the simulator verifies the complete behavior of a design in a more efficient manner than traditional simulation.

Design Verification Flow

FIG. 1 is a flow diagram of one embodiment of a process comprising a series of processing steps to simulate a design. The process may be performed by processing logic which may comprise software, hardware or a combination of both.

Referring to FIG. 1, the process augments a design to specify to the simulator the signals to treat as symbolic (processing block 101). The signals may be inputs, interrupts, memory values, or any other portion of a design that may be represented as an object in a hardware description language.

In one embodiment, the input engine of the simulator accepts a Verilog netlist of a block and the users instructs the simulator to run with one, more or all inputs symbolically. In such a case, the user may specify which inputs using a programming language interface (PLI) command which is inserted into the design flow. Other languages may have other similar mechanisms to the PLIs, such as for example using an API in HDL, and may be used in the same manner.

In one embodiment, the process instructs the simulator using the following PLI command:

$esp_var(a, b, . . . )

which causes the simulator to designate the objects a, b, etc. as symbols. In one embodiment, any number of objects may be listed in the PLI command. A symbol database may be used to keep track of the definitions of each symbol.

Then, the process compiles the design description (processing block 102). During compile, the symbolic variables are recognized, via the PLIs, and an internal intermediary structure for the symbolic simulator.

Figure 2:
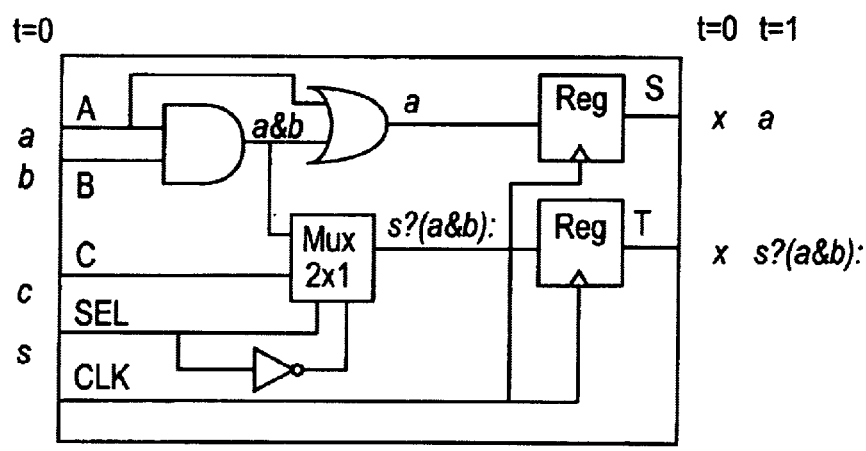
FIG. 2 is a block diagram of a circuit showing symbolic simulation propagating symbols in logic expressions.

Next, the process performs symbolic simulation (processing block 103). Symbolic simulation allows the designer to add symbols to existing binary values (0, 1, X and Z) during simulation. When the simulator detects symbol input, it propagates a boolean expression instead of propagating the digital value that is the result of the logical operation on the inputs. As the expressions are propagated, they capture the input/output mapping for all possible conditions. Although the final output expression may be very lengthy, they can readily be used to check against specified assertions or to compare against a reference model, particularly where the reference model is in symbolic format as well. By using symbols, one is able to fully verify a block without having to select a set of values. FIG. 2 illustrates an example of expressions being propagated from the input to the output of a design.

While performing symbolic simulation, the simulator is instructed to make checks to validate the functionality of the design. In one embodiment, another PLI command is inserted into the design specification in order to instruct the simulator to detect faults. If the design specification is in Verilog, one embodiment of the PLI command may be as follows:

$esp_error( )

which generates a file with the binary vector needed to locate the fault (so that debugging is implied.) In one embodiment, the file comprises binary value assignments for those symbolic variables declared by $esp_var.

After performing symbolic simulation, the process performs determines whether any error PLI (i.e., $esp_error) was executed (processing block 103). If no error PLI was executed, the process ends. If an error PLI was executed, the process generates a file, referred to herein as "esp_testvector", which includes the variable assignments (processing block 104). Then, based on the contents of the file, the process replays or uses a binary simulator environment to handle any faults.

An Exemplary Application

Figure 3:
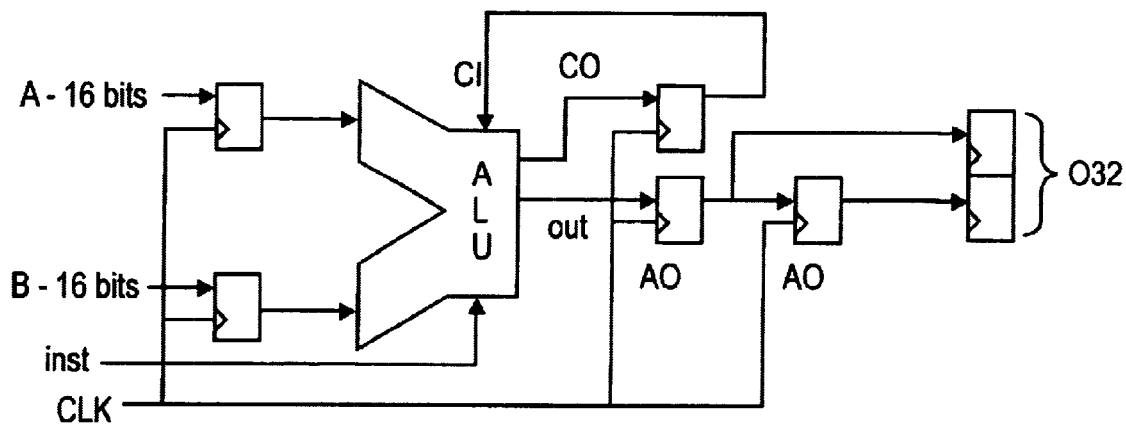
FIG. 3 is an exemplary arithmetic logic unit.

An exemplary circuit is shown in FIG. 3. Considering the testbench required to run the simulation, the following is given:

```
module test_bench( );
  reg [15:0] A, B, O32;
  reg CI;
  reg [3:0] INST;
  wire CO;
  reg [31:0] a,b
  reg [3:0] i;
  wire [15:0] out;
  DUT ALU (A,B,INST,CLK,out, CO);
  initial begin
    $esp_var (a,b,i);
    A=a[15:0];
    B=b[15:0];
    CI=1'b0;
    INST=i;
    # cycle
    O32 [15:0]=out;
    A=a [31:16];
    B=b [31:16];
    CI=CO;
    # cycle
    O32 [31:16]=out
    if ((INST==4'b0100) & ({CO, O32} !==(a+b))) // addition checking begin
      $display("ALU ERROR: addition error is detected");
      $esp_error("Binary vector is created for error detection");
    end
  end
endmodule
```

In the case of the ALU, it is possible to run one symbolic test vector sweep and fully verify the block. The $esp_var command instructs the simulator to interpret the variables as symbolic and, using a series of assert statements, the user can verify the functionality for every possible combination of input values. Additionally, there are a set of debugging commands, $display( ) and $esp_error( ), that will help track and eliminate bugs that symbolic simulation has highlighted.

Because of the use of the added commands, an individual does not have to spend any time deciding a set of input values, symbolic vectors cover every and all possible combinations. So, if no bugs are detected, the tester can have confidence that there is no combination of values that will cause an error to occur.

In one embodiment, all of the inputs are not treated symbolically. This may be the result of too little or unacceptable memory usage. The user may be allowed to select which inputs require the use symbols. In an alternative embodiment, the testing engine randomly selects symbols. The selection may be based on ensuring that the simulation finishes. The user is notified of which signals were associated with symbols.

In one embodiment, the simulator accepts Verilog behavior, RTL, gate and transistor level inputs and works with most standard PLI routines. In one embodiment, a SPICE netlist is converted to a Verilog switch level netlist. In such a case, the symbolic simulator runs symbolic simulation on the transistor level netlist and compares the results with and RTL description. Thus, if using self-checking or reference models in Verilog, there is very little change required to use symbolic simulation.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

Thus, a method and apparatus for improved design verification has been described.

We claim:

1. A method for performing design verification, the method comprising:
   specifying at least one description language object that represents at least one signal as a symbol in a design using a first statement that is part of a description language, wherein the first statement comprises a Programming Language Interface (PLI) statement; and
   instructing a symbolic simulator in response to the first statement to treat the at least one description language object as a symbol.

2. The method defined in claim 1 further comprising:
   inserting the first statement into a design specification; and
   inputting the design specification into the symbolic simulator.

3. The method defined in claim 1 wherein the at least one description language object comprise a hardware description language object.

4. The method defined in claim 1 wherein the at least one description language object comprises a Verilog object.

5. The method defined in claim 1 wherein the at least one signal comprises an input.

6. The method defined in claim 1 further comprising:
   specifying a check using a second statement, the check to perform a test to validate design functionality; and
   instructing the symbolic simulator using the second statement to perform the test.

7. The method defined in claim 6 further comprising:
   inserting the first and second statements into a design specification; and
   inputting the design specification into the symbolic simulator.

8. The method defined in claim 6 wherein the second statement comprises a PLI command.

9. The method defined in claim 6 further comprising:
instructing the symbolic simulator to generate a file with information to locate an identified fault.

10. An article of manufacture having at least one recordable medium having stored thereon executable instructions which, when executed by at least one processing device, cause the at least one processing device to:
specify at least one description language object that represents at least one signal as a symbol in a design using a first statement that is part of a design language, wherein the first statement comprises a Programming Language Interface (PLI) statement; and
instruct a symbolic simulator in response to the first statement to treat the at least one description language object as a symbol.

11. The article of manufacture defined in claim 10 further comprising executable instructions stored on the at least one recordable medium which, when executed by at least one processing device, cause the at least one processing device to:
insert the first statement into a design specification; and
input the design specification into the symbolic simulator.

12. The article of manufacture defined in claim 10 wherein the at least one description language object comprise a hardware description language object.

13. The article of manufacture defined in claim 10 wherein the at least one description language object comprises a Verilog object.

14. The article of manufacture defined in claim 10 wherein the at least one signal comprises an input.

15. The article of manufacture defined in claim 10 further comprising executable instructions stored on the at least one recordable medium which, when executed by at least one processing device, cause the at least one processing device to:
specify a check using a second statement, the check to perform a test to validate design functionality; and
instruct the symbolic simulator using the second statement to perform the test.

16. The article of manufacture defined in claim 15 further comprising executable instructions stored on the at least one recordable medium which, when executed by at least one processing device, cause the at least one processing device to:
insert the first and second statements into a design specification; and
input the design specification into the symbolic simulator.

17. The article of manufacture defined in claim 15 wherein the second statement comprises a PLI command.

18. The article of manufacture defined in claim 15 further comprising executable instructions stored on the at least one recordable medium which, when executed by at least one processing device, cause the at least one processing device to:
instruct the symbolic simulator to generate a file with information to locate an identified fault.

* * * * *